US009313878B2

(12) United States Patent
Woodward, Jr.

(10) Patent No.: US 9,313,878 B2
(45) Date of Patent: Apr. 12, 2016

(54) METHODS AND CIRCUIT STRUCTURES FOR MITIGATING VOLTAGE STRESSES ON PRINTED CIRCUIT BOARD (PCB) IN HIGH VOLTAGE DEVICES

(71) Applicant: Robert Clark Woodward, Jr., Cambridge, MA (US)

(72) Inventor: Robert Clark Woodward, Jr., Cambridge, MA (US)

(73) Assignee: DOBLE ENGINEERING COMPANY, Watertown, MA (US)

( * ) Notice: Subject to any disclaimer, the term of this patent is extended or adjusted under 35 U.S.C. 154(b) by 93 days.

(21) Appl. No.: 14/206,366

(22) Filed: Mar. 12, 2014

(65) Prior Publication Data

US 2014/0262445 A1    Sep. 18, 2014

Related U.S. Application Data

(60) Provisional application No. 61/783,901, filed on Mar. 14, 2013.

(51) Int. Cl.
*G06F 17/50* (2006.01)
*H05K 1/02* (2006.01)
*H05K 1/16* (2006.01)

(52) U.S. Cl.
CPC ............ *H05K 1/0254* (2013.01); *H05K 1/0298* (2013.01); *H05K 1/162* (2013.01)

(58) Field of Classification Search
CPC ....................................................... G06F 17/50
USPC ........................................................ 716/137
See application file for complete search history.

(56) References Cited

U.S. PATENT DOCUMENTS

| 6,970,341 | B1 | 11/2005 | Devoe et al. | |
|---|---|---|---|---|
| 2006/0055049 | A1* | 3/2006 | Nelson et al. | 257/774 |
| 2009/0139760 | A1 | 6/2009 | Tanaka | |
| 2012/0241906 | A1 | 9/2012 | Nakanishi | |

OTHER PUBLICATIONS

International Search Report and Written Opinion received in Application No. PCT/US14/24052 dated Jul. 7, 2014.

* cited by examiner

*Primary Examiner* — Thuan Do
(74) *Attorney, Agent, or Firm* — Brinks Gilson & Lione (57) ABSTRACT

A method for mitigating voltage stress on a PCB includes applying AC voltage to a multi-terminal condenser structure of a multi-layered PCB. The terminal condenser structure is formed by overlapping a plurality of conductive traces between board layers of the multi-layered PCB. A corresponding dielectric layer is disposed between the overlapping conductive traces of the board layers. The overlapping conductive traces include a first terminal, a second terminal, a third terminal, and a fourth terminal. The first terminal and the third terminal are disposed on a first layer of the multi-layered PCB, and the second terminal and the fourth terminal are disposed on a bottom layer of the multi-layered PCB. The first terminal and the second terminal are connected to a ground point, and the third terminal and the fourth terminal are connected to the AC voltage. Voltage stresses on the PCB are mitigated utilizing the multi-terminal condenser structure.

20 Claims, 8 Drawing Sheets

METHODS AND CIRCUIT STRUCTURES FOR MITIGATING VOLTAGE STRESSES ON PRINTED CIRCUIT BOARD (PCB) IN HIGH VOLTAGE DEVICES

CROSS-REFERENCE TO RELATED APPLICATIONS

The application claims priority and benefits to U.S. Provisional Application No. 61/783,901, titled "Methods and Circuit Structures for controlling Voltage stresses on Printed Circuit Board (PCB) in High Voltage Devices", filed on Mar. 14, 2013, which is incorporated by reference in its entirety.

FIELD OF THE TECHNOLOGY

The present application relates to methods and circuit structures for mitigating voltage stresses on printed circuit boards (PCB), which are used in high voltage devices.

BACKGROUND

High voltage switching power supplies utilize multiple PCBs for both control circuits and power generation circuits. Board circuit traces and the components mounted on the circuit board are under high voltage stress due to high voltage fields. Therefore, grounding design for high voltage PCBs is always a challenging task. More particularly, high power devices are highly integrated where high density components are mounted on limited board space. In addition, multiple PCBs are mounted within close proximity to each other with little board space clearance and with little clearance to the surrounding walls of the device enclosure.

For example, a 15 kV RMS high voltage source within an instrument case for measuring a high power utility device often has limited space clearance, which may pose a safety concern. A traditional solution would be to mount or support the high voltage source on long insulators, or to submerge the high voltage source in a liquid insulator, or use potting material. This solution, however, is not practical, since there is not enough space to use adequately long insulators. In addition, weight restrictions prevent using liquid or solid encapsulates to insulate the high voltage source.

SUMMARY

An embodiment of the present disclosure has provided a method for mitigating voltage stresses on a printed circuit board (PCB). The method includes: applying an alternating current (AC) voltage to a multi-terminal condenser structure of a multi-layered PCB, wherein the terminal condenser structure is formed by overlapping a plurality of conductive traces between board layers of the multi-layered PCB, wherein a corresponding dielectric layer is disposed between the plurality of overlapping conductive traces of the board layers, wherein the plurality of overlapping conductive traces include: at least a first terminal a second terminal, a third terminal and a fourth terminal, wherein the first terminal and the third terminal are disposed on a first layer of the multi-layered PCB, and the second terminal and the fourth terminal are disposed on a bottom layer of the multi-layered PCB; wherein the first terminal and the second terminal are connected to a ground point, and the third terminal and the fourth terminal are connected to the AC voltage; and mitigating voltage stresses on the PCB utilizing the multi-terminal condenser structure to by-pass AC currents from the applied AC voltage to the ground point.

In another embodiment of the disclosure, a multi-terminal condenser structure implemented on a multi-layered printed circuit board (PCB) is disclosed. The multi-terminal condenser structure may include: a plurality of overlapping conductive traces between board layers of the multi-layered PCB forming the multi-terminal condenser structure, wherein a corresponding dielectric layer is disposed between the plurality of overlapping conductive traces of the board layers, wherein the plurality of overlapping conductive traces include: at least a first terminal, a second terminal, a third terminal and a fourth terminal, wherein the first terminal and the second terminal are connected to a ground point, and the third terminal and the fourth terminal are connected to the AC voltage source, wherein the PCB structure controls voltage stresses when an alternating current (AC) voltage is applied to power circuitries on the PCB.

The various embodiments of the disclosure provide an effective solution to reduce voltage stress on high voltage PCBs, by creating a circuit structure within a multi-layer PCB. The circuit structure in effect is a voltage dividing capacitor circuit formed by a plurality of series and parallel capacitors utilizing the conductive traces on both ends of the multi-layered PCB, which form a multi-terminal condenser structure. The multi-terminal condenser effectively suppresses or bypasses high voltage electric fields radiated from the mounted components and from the circuit conductive traces of the PCB to the ground plane, thus enabling the board material to operate within a safety limit as specified by the manufacturer.

The capacitive layers in the multi-terminal condenser structure mitigates voltage fields distribution on the surface of the PCB to prevent arcing or flashover. Creepage extenders may also be placed on the surface of the PCB to prevent flashover caused by contaminants.

The multi-terminal condenser structure allows for the use of traditional circuit card guides for mechanical support in the enclosure to enable air cooling to keep the weight down, while allowing the use of a 15 kV RMS AC voltage source to be integrated into a limited space of the instrument enclosure.

BRIEF DESCRIPTION OF THE DRAWINGS

The accompanying drawings are included to provide a further understanding of the claims. The drawings are incorporated in, and constitute a part of this specification. The detailed description and illustrated embodiments described serve to explain the principles defined by the claims.

DETAILED DESCRIPTION OF THE EMBODIMENTS

The various embodiments of the present disclosure are further described in details in combination with attached drawings and embodiments below. It should be understood that the specific embodiments described herein are used only to explain the present disclosure, and should not be construed as a limitation on the claims. In addition, for the sake of keeping description brief and concise, only the newly added features, or features that are different from those previously described in each new embodiment may be described in detail. Similar features may be referenced back to the prior descriptions in a prior numbered drawing or referenced ahead to a higher numbered drawing.

Figure 1A:
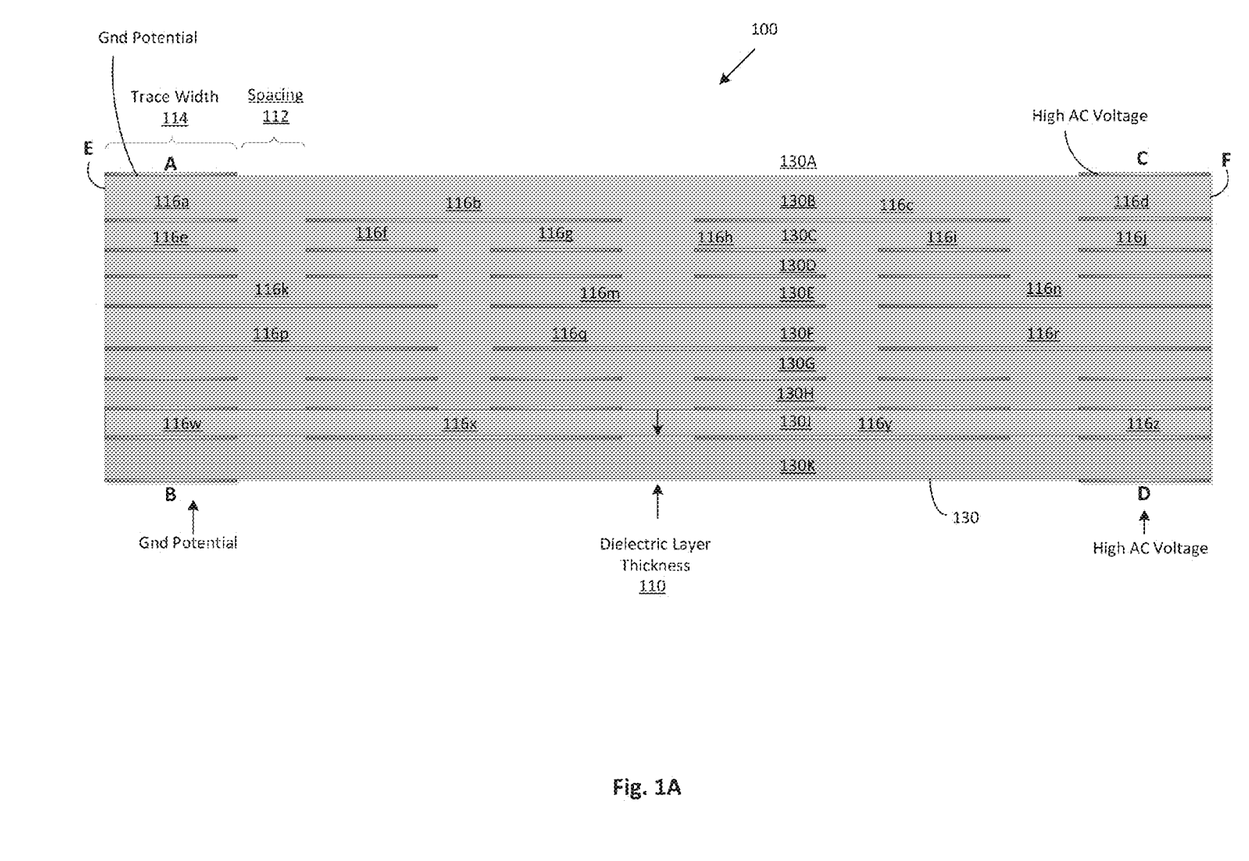
FIG. 1A illustrates a cross section view of an end of a multi-layered PCB of an exemplary multi-terminal condenser structure, according to an embodiment of the disclosure.

FIG. 1A illustrates a cross section view of an end portion of a multi-layered PCB (130) of an exemplary multi-terminal condenser structure (100), according to an embodiment of the disclosure. More specifically, the multi-terminal condenser structure (100) is formed by overlapping a plurality of conductive traces (A-D, 116a-116z) disposed between board layers (130A to 130K) of the multi-layered PCB (130), wherein a corresponding dielectric layer (110) is disposed between the plurality of overlapping conductive traces (A to D, 116a to 116z) of the board layers (130A to 130K), and wherein the multi-terminal condenser structure (100) includes at least a first terminal (A), a second terminal (B), a third terminal (C) and a fourth terminal (D). The first terminal (A) and the second terminal (B) are connected to a ground point. The third terminal (C) and the fourth terminal (D) are connected to an AC voltage source. The multi-terminal condenser structure mitigates voltage stresses when an alternating current (AC) voltage is applied to power circuitries (e.g., circuit traces 230A, 230C in FIG. 2D) on the PCB.

As illustrated, the exemplary multi-layered PCB (130) may include 10 layers (130A to 130K), where each layer has a corresponding conductive trace pattern. For example, layer 130A (i.e., the first layer) may include terminals A and C. Terminals A and C each may have a trace width (114) of about 0.120", and may be spaced apart at opposite ends (E and F) of the multi-terminal condenser structure (100). Layer 130B (i.e., 2$^{nd}$ layer) may include conductive traces (116a-116d) having respective trace widths of about 0.120", 0.296", 0.296" and 0.120". The various trace widths may be different or selected to suit a particular situation.

In some implementations, a uniform spacing (110) may be used between the conductive traces (116a-116z) throughout the intermediate PCB layers (100B-100J). Layer 130C (i.e., 3$^{rd}$ layer) may include plurality of conductive traces (116e-116j), each may have an exemplary trace width of 0.120" and each may be evenly spaced by a distance of 0.056". Likewise, layer 130K (i.e., 10$^{th}$ layer) includes terminals B and D, which may be arranged similarly to terminals A and C on the first layer 130A. In other implementations, the trace width (114) and spacing (112) may vary from layer to layer, and from design to design In addition, features of the multi-terminal condenser structure (100) may be symmetrically arranged along various lines of symmetry to optimize performance. For example, a line of symmetry may divide the 5$^{th}$ layer (130E) and the 6$^{th}$ layer (130F). Likewise, a line of symmetry may divide the conductive traces 116g and 116h. It should be noted that symmetry may not be a requirement for the multi-terminal condenser structure (100). An asymmetric multi-terminal condenser structure (100) may also be implemented as required in any given design.

In addition, respective dielectric layers (110) of a corresponding thickness may be disposed between the overlapping plurality of conductive traces (A-D, 116a-116z) of the board layers (130A to 130K). A network of interconnected series and parallel capacitors such as the multi-terminal condenser structure (100) may therefore be formed. In an embodiment, a uniform dielectric material may be used for each layer of the dielectric layer (110) for ease of PCB manufacturing. In other implementations, the dielectric material may vary from layer to layer to achieve design requirements.

Figure 1B:
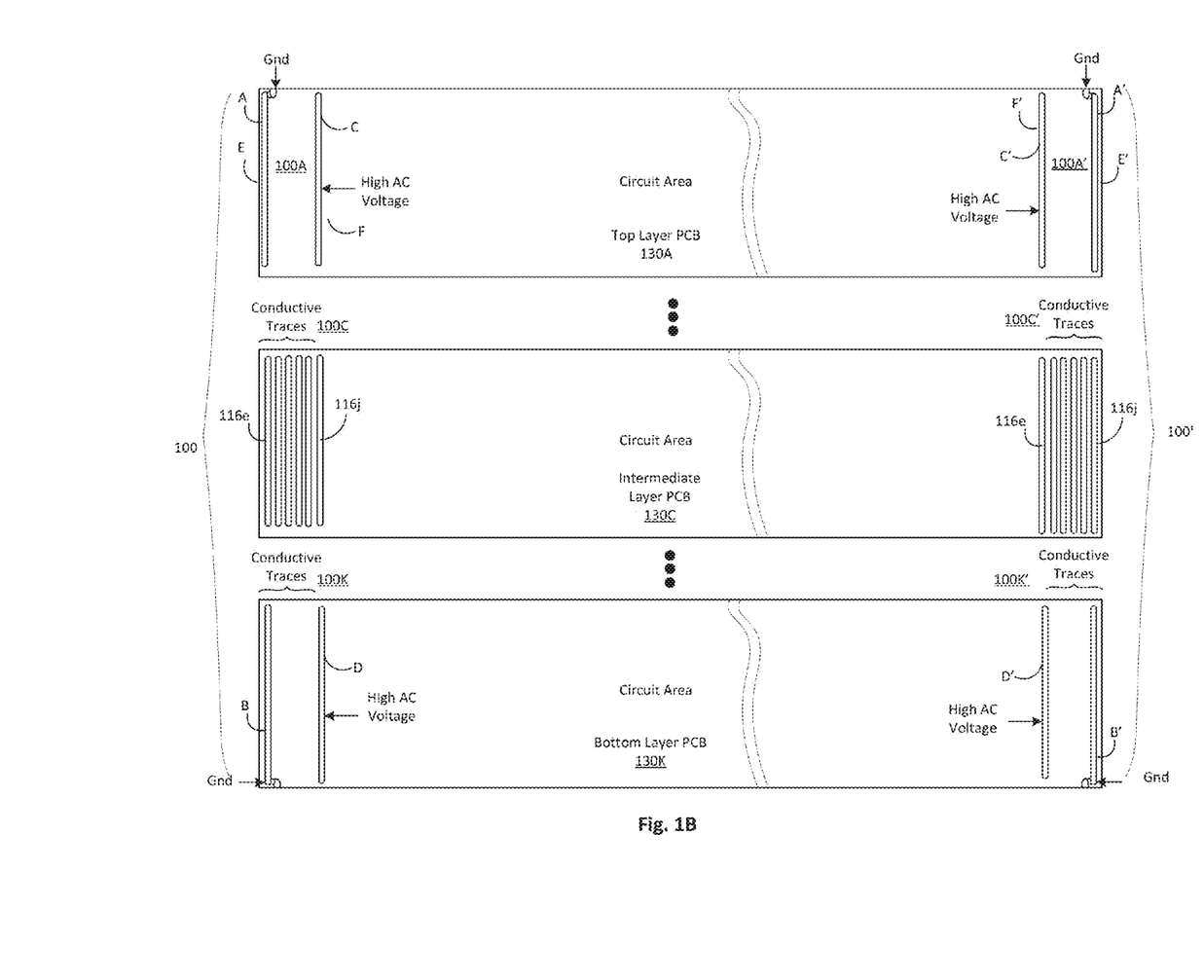
FIG. 1B illustrates a layer by layer projected view of an exemplary multi-terminal condenser structure associated with the multi-layered PCB FIG. 1A, according to an embodiment of the disclosure.

FIG. 1B illustrates a layer by layer projected view of an exemplary multi-terminal condenser structure which is associated with the multi-layered PCB in FIG. 1A. The multi-terminal condenser structure (100) may be formed by overlapping conductive traces (100A to 100K) between board layers of the multi-layered PCB (130). The exemplary multi-terminal condenser structure (100) includes at least a top layer (130A), at least an intermediate layer (i.e., 3rd layer (130C)) and a bottom layer (i.e., 10th layer 130K) of the multi-layered PCB (130). As shown in FIG. 1B, the conductive traces (100A) of the top layer (130A) may include the first terminal (A) and the third terminal (C). The conductive traces (100C) of the third layer (130C) may include the plurality of conductive traces (116e to 116j). The conductive traces (100K) of the bottom layer (130K) may include the second terminal (B) and the fourth terminal (D).

In an embodiment, the ground point (GND) may be adjacent to an edge (E) of the multi-layered PCB. In an embodiment, the third and the fourth terminals (C, D) may be disposed on an opposite end (F) of the multi-terminal condenser structure (100) away from the first and the second terminals (A, B).

In an embodiment, the multi-layered PCB structure (130) further includes two multi-terminal condenser structures (100, 100'), each is disposed on opposite ends (E, E') of the multi-layered PCB.

Figure 1C:
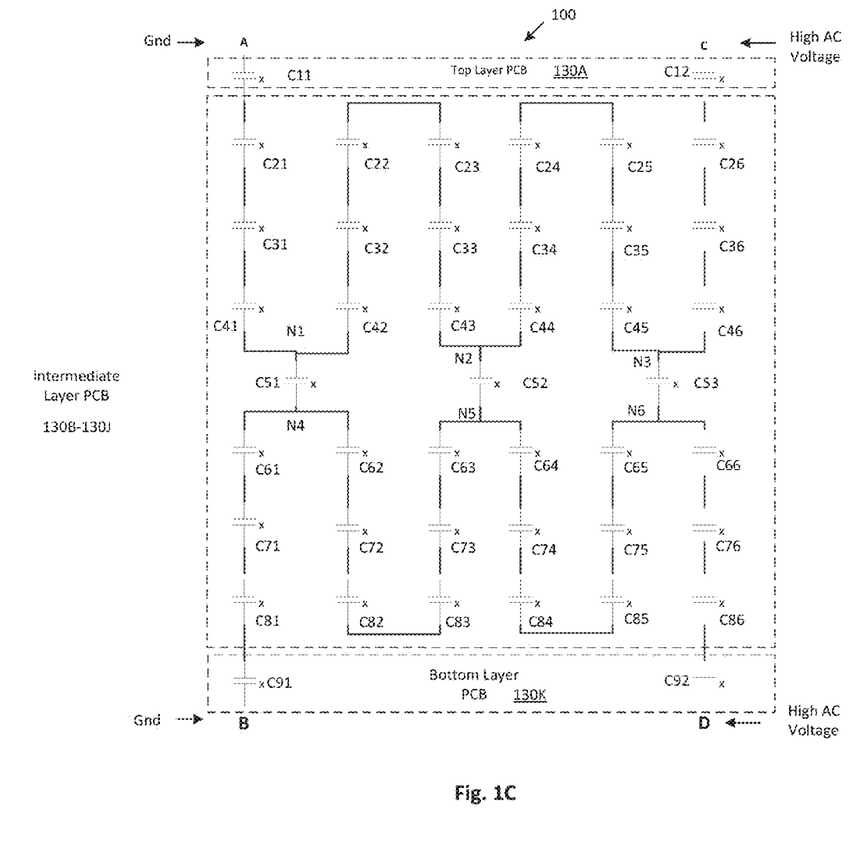
FIG. 1C illustrates a schematic representation of the exemplary multi-terminal condenser structure of FIGS. 1A and 1B, according to an embodiment of the disclosure.

FIG. 1C illustrates a schematic representation of the exemplary multi-terminal condenser structure (100) on an end of the multi-layered PCB as illustrated in FIGS. 1A and 1B, according to an embodiment. As illustrated, AC grounding may be provided through capacitive coupling of AC signals within the multi-terminal condenser structure (100).

In an embodiment of the disclosure, the capacitive coupling may include a first group of series capacitors (i.e., C11, C21, C31, C41, C42, C32, C22, C23, C33, C43, C44, C34, C24, C25, C35, C45, C46, C36, C26, C12), which may be formed between a first terminal (A) and a third terminal (C), a second group of series capacitors (C91, C81, C71, C61, C62, C72, C82, C83, C73, C23, C64, C74, C84, C85, C75, C65, C66, C76, C86, C92), which may be formed between a second terminal (B), and a fourth terminal (D).

Furthermore, a plurality of parallel capacitors (i.e., C51, C52, C53) may be formed between the first plurality of series capacitors and the second plurality of series capacitors. The parallel capacitors (i.e., C51, C52, C53) may function as coupling capacitors, which couple along the first group of series capacitors to the second group of series capacitors at respective node pairs (N1/N4, N2/N5 and N3/N6) in the multi-terminal condenser structure (100).

In addition, the formation of the first group of series capacitors (i.e., C11, C21, C31, C41, C42, C32, C22, C23, C33, C43, C44, C34, C24, C25, C35, C45, C46, C36, C26, C12), the second group of series capacitors (C91, C81, C71, C61, C62, C72, C82, C83, C73, C23, C64, C74, C84, C85, C75, C65, C66, C76, C86, C92) and the group of parallel capacitors (i.e., C51, C52, C53) may be of parallel plate capacitors type, which are formed by the overlapping conductive traces (i.e., A-D, 116a-116z) among the board layers (130A-130K) of the multi-layered PCB (130).

For example, series capacitor C11 may be formed between terminal A and conductive trace (116a). Series capacitor C21 may be formed between conductive traces (116a and 116e). Series capacitors C91 and C92 may be formed between terminal B and conductive trace (116w) and terminal D and conductive trace (116z), respectively. Likewise, the parallel capacitors (C51, C52 and C53) may be formed between conductive traces (116k and 1116p), conductive traces (116m and 116q) and conductive traces (116n and 116r), respectively.

In an embodiment of the disclosure, the capacitance values (e.g., 65 pF on C11, 104 pF on C21 . . . 65 pF on C12) of the first plurality of series capacitors may be designed to mirror to the capacitance values (e.g., 65 pF on C91, 104 pF on C81 . . . 65 pF on C92) of the corresponding second plurality of series capacitors. Yet in the same embodiment, the capacitance values (e.g., 0.65 pF) of the plurality of parallel capacitors (C51 to C53) may be designed to match each other, thus forming a symmetrical multi-terminal condenser structure (100).

In the same embodiment disclosed in FIG. 1C, the arrangement of the first group of series capacitors (i.e., C11, C21, C31, C41, C42, C32, C22, C23, C33, C43, C44, C34, C24, C25, C35, C45, C46, C36, C26, C12) may function as a first bypass capacitor for the high AC voltage applied across terminals C and A. The second group of series capacitors (C91, C81, C71, C61, C62, C72, C82, C83, C73, C23, C64, C74, C84, C85, C75, C65, C66, C76, C86, C92) may function as a second bypass capacitor for the high AC voltage applied across terminals D and B. In addition, capacitors C51, C51 and C53 may function as adjacent coupling capacitors, which couple between the two high AC voltages applied to terminals C and D, respectively.

As previously mentioned in FIG. 1A, symmetry may not be a requirement for the multi-terminal condenser structure (100). It is understood that an asymmetric multi-terminal condenser structure (100) may also be implemented to achieve target design requirements.

To summarize, the disclosed multi-terminal condenser structure (100) (whether symmetrical or not) may provide effective bypass of electric fields to relieve voltages stresses caused by the high AC voltages applied to the multi-layered PCB (130). A symmetrical design, however, may provide a more stable bypass solution for bypassing the high voltage electric fields.

Figure 2A:
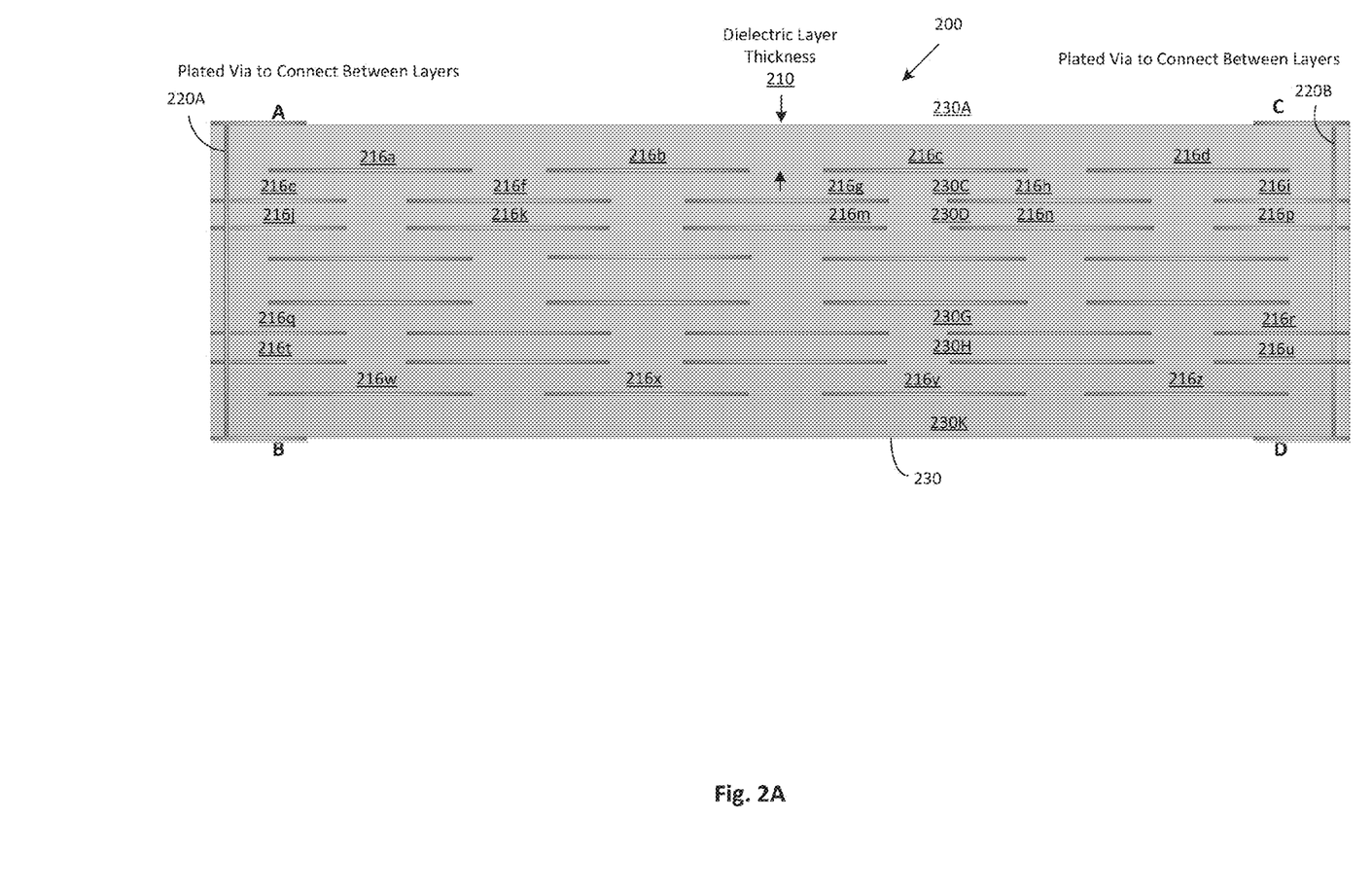
FIG. 2A illustrates a cross section view of an end of a multi-layered PCB of an exemplary multi-terminal condenser structure, according to another embodiment of the disclosure.

FIG. 2A illustrates a cross section view of an end of a multi-layered PCB (230) of another exemplary multi-terminal condenser structure (200). More specifically, FIG. 2A is similar to FIG. 1A, except that the conductive traces (216a to 216z) in the intermediate board layers (230B to 230J) may have different conductive trace widths and spacing, thus forming different capacitance values for the multi-terminal condenser structure (200).

In addition, FIG. 2A discloses that a first plated via hole (220A) may be used to tie the first and the second terminals (i.e., A and B) to a DC return ground point (GND), where the first plated via hole (220A) may directly connect respective overlapping conductive traces (216e, 216j, 216q, 216t) above or below the first and the second terminals (i.e., A and B).

Similarly, a second plated via hole (220B) may be used to tie the applied AC voltage at the third and the fourth terminals (C and D). The second plated via hole (220B) may directly connect respective overlapping conductive traces (216i, 216p, 216r, 216u) above or below the third and the fourth terminals (C, D).

Figure 2B:
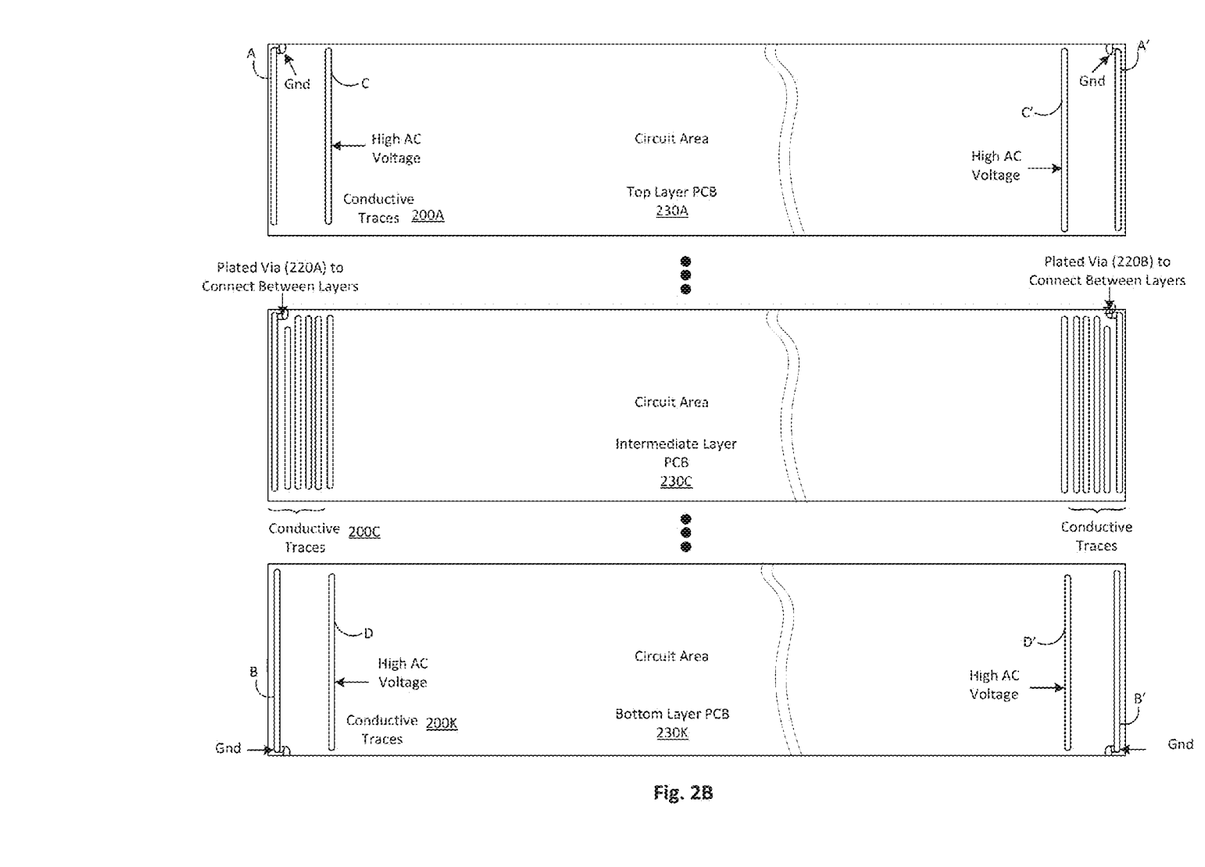
FIG. 2B illustrates a layer-by-layer projected view of the exemplary multi-terminal condenser structure associated with the multi-layered PCB of FIG. 2A, according to an embodiment of the disclosure.

FIG. 2B illustrates a layer-by-layer projected view of the exemplary multi-terminal condenser structure associated with the multi-layered PCB (230) of FIG. 2A. The multi-terminal condenser structure (200) may be formed on both ends of the PCB (230) by overlapping conductive traces (200A to 200K) between board layers (230B to 230J) of the multi-layered PCB (230). The first plated via hole (220A) may be used to tie the overlapping conductive traces (216e, 216j, 216q and 216t) to the ground point (GND) at the first and second terminals (i.e., A and B), and the second plated via hole (220B) may be used to tie the overlapping conductive traces (216i, 216p, 216r and 216u) to the AC voltage terminals at the third and fourth terminals (i.e., C, D).

Figure 2C:
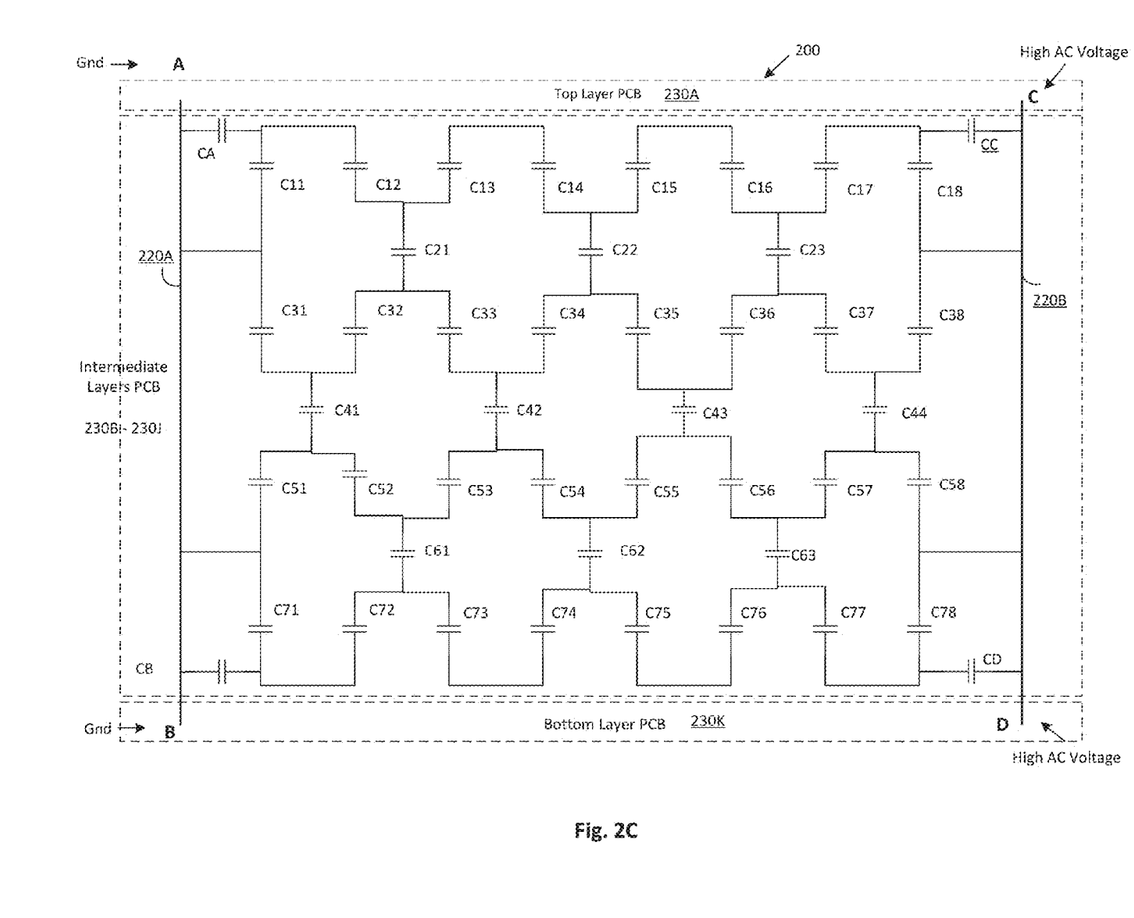
FIG. 2C illustrates a schematic representation of an exemplary multi-terminal condenser structure of FIG. 2A, according to an embodiment of the disclosure.

FIG. 2C illustrates a schematic representation of an exemplary multi-terminal condenser structure (200) of FIG. 2A. As shown, the multi-terminal condenser structure (200) may include four groups of series capacitors, three coupling capacitors sets, and four terminal fringe capacitors.

The first group of series capacitors (i.e., C11 to C18) may be formed across ground terminals (A and B) and AC voltage terminals (C and D). The second group of series capacitors (i.e., C31 to C38) may be formed across ground terminals (A and B) and AC voltage terminals (C and D). A third group of series capacitors (i.e., C51 to C58) may be formed across ground terminals (A and B) and AC voltage terminals (C and D). A fourth group of series capacitors (i.e., C71 to C78) may be formed across ground terminals (A and B) and AC voltage terminals (C and D).

A first coupling capacitor set (C21 to C23) couples between the first (C11 to C18) and the second (C31-C38) plurality of series capacitors. A second coupling capacitor set (C41 to C44) couples between the second (C31-C38) and the third (C51-C58) plurality of series capacitors. A third coupling capacitor set (C61 to C63) couples between the third (C51-C58) and the fourth (C71-C78) plurality of series capacitors.

The four terminal fringe capacitors correspond to CA, CB, CC and CD for terminals A, B, C and D, respectively.

As seen, a symmetry line may be formed along the second coupling capacitor set (C41 to C44) to divide the multi-terminal condenser structure (200) into two symmetrical halves mirroring each other. It should also be noted that the value of the series capacitors (C11-C18, C31-C38, C51-C58 and C71-C78) may be uniform in value (e.g., 104 pF). Likewise, the coupling capacitor sets (C21-C23, C41-C44 and C61-C63) may be uniform in value (e.g., 0.65 pF). Moreover, the four terminal fringe capacitors (being CA, CB, CC and CD) may also be uniform in value (e.g., 0.3 pF).

As previously mentioned in FIG. 1A, symmetry may not be a requirement for the multi-terminal condenser structure (200). An asymmetric multi-terminal condenser structure (200) may also be implemented as required by design.

Figure 2D:
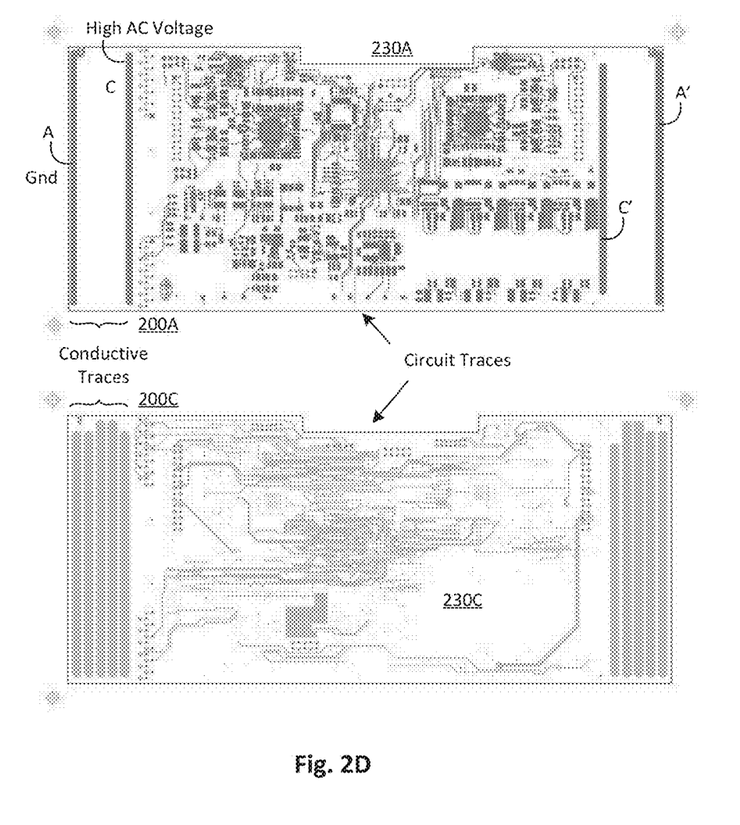
FIG. 2D depicts a projected view of exemplary conductive traces of a first layer and an intermediate layer of a multi-terminal condenser structure as depicted in FIG. 2A, according to an embodiment of the disclosure.

FIG. 2D depicts a projected view of an actual implementation of conductive traces (200A) of a first layer (230A), and conductive traces (200C) of an intermediate layer (230C), in the multi-terminal condenser structure (200) as depicted in FIG. 2A. As shown, a high AC voltage may be supplied to both terminals C and C' on opposite ends of the PCB (230), and the terminals A and A' may be grounded to the enclosure through respective ground points (GND).

Figure 3:
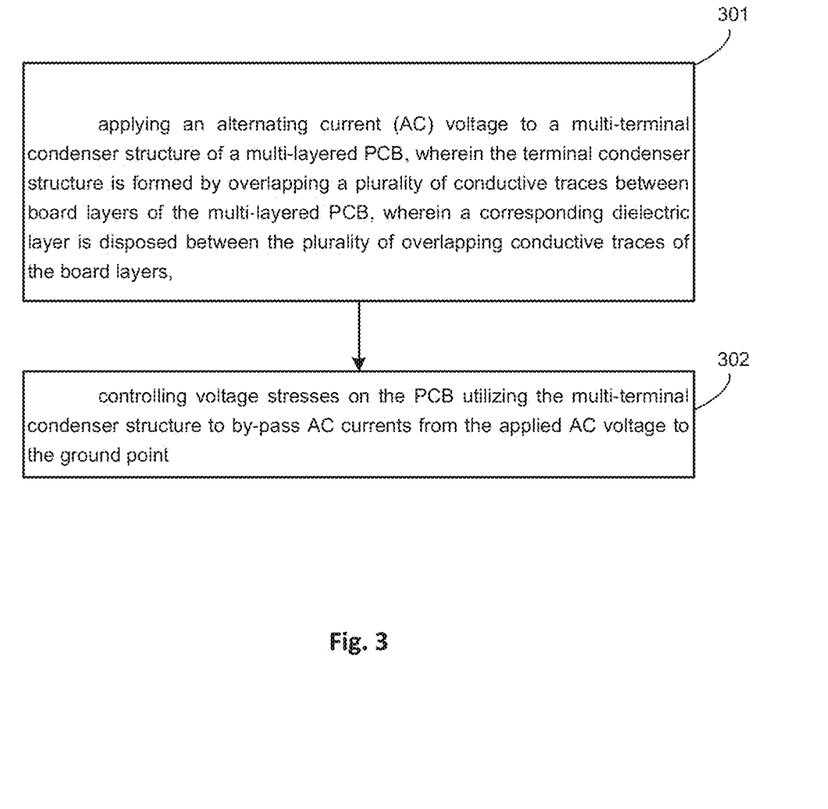
FIG. 3 is a flow chart illustrating exemplary operations that may be performed for mitigating voltage stresses on a PCB.

FIG. 3 is a flow chart illustrating exemplary operations that may be performed for mitigating voltage stresses on a PCB.

At block 301 an alternating current (AC) voltage may be applied to a multi-terminal condenser structure (100) of a multi-layered PCB (130). The terminal condenser structure (100) may be formed by overlapping a group of conductive traces (100A-100K) between board layers (130A-130K) of the multi-layered PCB (130). A corresponding dielectric layer may be disposed between the overlapping conductive traces (100A-100K) of the board layers (130A-130K).

In some implementations, the overlapping conductive traces (100A-100K) may include at least a first terminal (A), a second terminal (B), a third terminal (C), and a fourth terminal (D). The first terminal (A) and the third terminal (C) are disposed on a first layer (130A) of the multi-layered PCB (130), and the second terminal (B) and the fourth terminal (D) are disposed on a bottom layer (130K) of the multi-layered PCB (130). The first terminal (A) and the second terminal (B) may be connected to a ground point (GND), and the third terminal (C) and the fourth terminal (D) may be connected to the AC voltage.

At block 302, voltage stresses on the PCB (130) may be mitigated by utilizing the multi-terminal condenser structure (100) to bypass AC currents from the applied AC voltage to the ground point (GND).

In one implementation, the first and the second terminals (A and B) may be connected to a return ground point (GND) adjacent to an edge (E) of the multi-layered PCB (130). The third and the fourth terminals (C, D) may be disposed on an opposite end (F) of the multi-terminal condenser structure (100) away from the first and the second terminals (A and B).

AC grounding may be provided through capacitive coupling of AC signals within the multi-terminal condenser structure (100). The capacitive coupling may be provided by forming a first group of series capacitors (i.e., C11, C21, C31, C41, C42, C32, C22, C23, C33, C43, C44, C34, C24, C25, C35, C45, C46, C36, C26, C12) between the first terminal (A) and the third terminal (C). A second group of series capacitors (C91, C81, C71, C61, C62, C72, C82, C83, C73, C23, C64, C74, C84, C85, C75, C65, C66, C76, C86, C92) may be formed between the second terminal (B) and the fourth terminal (D). A group of parallel capacitors (C51-C53) may also be formed between the first group of series capacitors and the second plurality of series capacitors by coupling at a plurality of respective node pairs (N1/N4, N2/N5 and N3/N6) along the first plurality of series capacitors to the second group of series capacitors.

In the embodiment of FIG. 1C, the capacitance values of the first group of series capacitors may be mirrored to capacitance values on the second group of series capacitors, and capacitance values on the group of parallel capacitors may be identical, thus forming a symmetrical multi-terminal condenser structure (100). The first and the second group of series capacitors may each form a respective group of secondary parallel capacitors across the first and the third terminals (A and C), and across the second and the fourth terminals (B and D) through adjacent coupling of the overlapping conductive traces between board layers of the multi-layered PCB.

In the embodiment of FIG. 1B, AC voltage may be applied to two multi-terminal condenser structures (100, 100'), which are disposed on opposite ends (E and E') of the multi-layered PCB (130).

In the embodiment of FIG. 2A, the first and the second terminals (A, B) of the multi-terminal condenser structure (100) may be tied to the return ground point (GND) through a first plated via holes (220A). The first plated via hole (220A) may directly connect respective conductive traces (216e, 216j, 216q, 216t) above or below the first and the second terminals (A and B). The applied AC voltage at the third and the fourth terminals (C and D) may be tied through a second plated via hole (220B). The second plated via hole (220B) directly connects respective overlapping conductive traces (216i, 216p, 216r, 216u) above or below the third and the fourth terminals (C and D).

As described, the multi-terminal condenser effectively suppresses or bypasses high voltage electric fields radiated from the mounted components and from the circuit conductive traces of the PCB to the ground plane, thus allowing the PCB to operate within a safety limit as specified by the manufacturer. The various embodiments of the multi-terminal condenser structure may be practiced on any standard multi-layered PCBs or multi-layered substrate types, including duroid softboards, ceramics, semiconductors or the like.

It should be apparent to those skilled in the art that various modifications and variations on the physical dimensions or the conductive traces and capacitance values can be made to the present disclosure without departing from the scope or spirit of the disclosure. In view of the foregoing, the present disclosure covers modifications and variations which fall within the scope of the following claims and their equivalents.

What is claimed is:

1. A method for mitigating voltage stresses on a printed circuit board (PCB), comprising:
    forming a multi-terminal condenser structure on a multi-layered PCB and the multi-terminal condenser structure is configured to by-pass electric fields of an alternating current (AC) voltage applied to the multi-terminal condenser structure, which powers circuitries external to the multi-terminal condenser structure, wherein the multi-terminal condenser structure itself is free from having PCB components mounted thereon, wherein:
    the multi-terminal condenser structure is formed by overlapping a plurality of conductive traces disposed between board layers of the multi-layered PCB,
    a corresponding dielectric layer is disposed between the plurality of overlapping conductive traces of the board layers, wherein the plurality of overlapping conductive traces comprise:
        at least a first terminal a second terminal, a third terminal and a fourth terminal, wherein the first terminal and the third terminal are disposed on the first layer of the multi-layered PCB, and the second terminal and the fourth terminal are disposed on the bottom layer of the multi-layered PCB;
        wherein the first terminal and the second terminal are connected to a ground point as the only return ground point for AC currents, and the third terminal and the fourth terminal are connected to the AC voltage; and
    mitigating voltage stresses on the PCB utilizing the multi-terminal condenser structure to by-pass the AC currents from the applied AC voltage to the ground point.

2. The method according to claim 1, comprising connecting the first and the second terminals to a return ground point adjacent to an edge of the multi-layered PCB.

3. The method according to claim 2, comprising tying the first and the second terminals to the return ground point through a first plated via hole, wherein the first plated via hole directly connects respective overlapping conductive traces above or below the first and the second terminals.

4. The method according to claim 1, comprising disposing the third and the fourth terminals on an opposite end of the multi-terminal condenser structure away from the first and the second terminals.

5. The method according to claim 1, comprising:
providing AC grounding through capacitive coupling of AC signals within the multi-terminal condenser structure, wherein formation of the capacitive coupling comprises:
forming a first plurality of series capacitors between the first terminal and the third terminal;
forming a second plurality of series capacitors between the second terminal and the fourth terminal; and
forming a plurality of parallel capacitors between the first plurality of series capacitors and the second plurality of series capacitors by coupling at a plurality of respective node pairs along the first plurality of series capacitors to the second plurality of series capacitors.

6. The method according to claim 1, wherein the first plurality of series capacitors, the second plurality of series capacitors and the plurality of parallel capacitors between first plurality of series capacitors and the second plurality of series capacitors are formed by overlapping the conductive traces between board layers of the multi-layered PCB.

7. The method according to claim 1, wherein capacitance values on the first plurality of series capacitors are mirrored to capacitance values on the second plurality of series capacitors, and capacitance values on the plurality of parallel capacitors are identical, thus forming a symmetrical multi-terminal condenser structure.

8. The method according to claim 1, wherein the first and the second plurality of series capacitors each forms a respective plurality of secondary parallel capacitors across the first and the third terminals, and across the second and the fourth terminals, through adjacent coupling of the overlapping the conductive traces between board layers of the multi-layered PCB.

9. The method according to claim 1, comprising applying a AC voltage to two multi-terminal condenser structures which are disposed on opposite ends of the multi-layered PCB.

10. The method according to claim 1, comprising tying the applied AC voltage at the third and the fourth terminals through a second plated via hole, wherein the second plated via hole directly connects respective overlapping conductive traces above or below the third and the fourth terminals.

11. A circuit structure for mitigating voltage stress on a multi-layered printed circuit board (PCB), the circuit structure comprises:
a plurality of overlapping conductive traces disposed between board layers of the multi-layered PCB forming a multi-terminal condenser structure and the multi-terminal condenser structure is configured to by-pass electric fields of an alternating current (AC) voltage applied to the multi-terminal condenser structure which powers circuitries external to the multi-terminal condenser structure, wherein the multi-terminal condenser structure itself is free from having PCB components mounted thereon, wherein:
a corresponding dielectric layer is disposed between the plurality of overlapping conductive traces of the board layers, wherein the plurality of overlapping conductive traces comprise:
at least a first terminal, a second terminal, a third terminal and a fourth terminal, wherein:
the first terminal and the third terminal are disposed on the first layer of the multi-layered PCB, and the second terminal and the fourth terminal are disposed on the bottom layer of the multi-layered PCB;
the first terminal and the second terminal are connected to a ground point as the only return ground point for AC currents, and the third terminal and the fourth terminal are connected to the AC voltage,
wherein the multi-terminal condenser structure mitigates voltage stresses in by-passing the electric fields caused by the applied alternating current (AC) voltage to power circuitries on the PCB.

12. The circuit structure according to claim 11, wherein the ground point is adjacent to an edge of the multi-layered PCB.

13. The circuit structure according to claim 12, further comprises a first plated via hole tying the first and the second terminals to the return ground point, wherein the first plated via hole directly connects respective overlapping conductive traces above or below the first and the second terminals.

14. The circuit structure according to claim 11, wherein the third and the fourth terminals are disposed on an opposite end of the multi-terminal condenser structure away from the first and the second terminals.

15. The circuit structure according to claim 11, wherein AC grounding is provided through capacitive coupling of AC signals within the multi-terminal condenser structure, wherein the capacitive coupling comprises:
a first plurality of series capacitors formed between the first terminal and the third terminal;
a second plurality of series capacitors formed between the second terminal and the fourth terminal; and
a plurality of parallel capacitors formed between the first plurality of series capacitors and the second plurality of series capacitors, wherein the plurality of parallel capacitors are formed by coupling at a plurality of respective node pairs along the first plurality of series capacitors to the second plurality of series capacitors.

16. The circuit structure according to claim 11, wherein the first plurality of series capacitors, the second plurality of series capacitors and the plurality of parallel capacitors between the first plurality of series capacitors and the second plurality of series capacitors are formed by overlapping the conductive traces among board layers of the multi-layered PCB.

17. The circuit structure according to claim 11, wherein capacitance values on the first plurality of series capacitors are mirrored to the capacitance values on the second plurality of series capacitors, and the capacitance values on the plurality of parallel capacitors are identical, thus forming a symmetrical multi-terminal condenser structure.

18. The circuit structure according to claim 11, wherein the first and the second plurality of series capacitors each forms a respective plurality of secondary parallel capacitors across the first and the third terminals, and across the second and the fourth terminals, through adjacent coupling of the overlapping the conductive traces between board layers of the multi-layered PCB.

19. The circuit structure according to claim 11, the multi-layered PCB structure comprises two multi-terminal condenser structures, which are disposed on opposite ends of the multi-layered PCB.

20. The circuit structure according to claim 11, further comprises a second plated via hole tying the applied AC voltage at the third and the fourth terminals, wherein the second plated via hole directly connects respective overlapping conductive traces above or below the third and the fourth terminals.

* * * * *